US009006065B2

(12) United States Patent
Yen et al.

(10) Patent No.: US 9,006,065 B2
(45) Date of Patent: Apr. 14, 2015

(54) PLASMA DOPING A NON-PLANAR SEMICONDUCTOR DEVICE

(71) Applicant: Advanced Ion Beam Technology, Inc., Hsin-Chu (TW)

(72) Inventors: Tzu-Shih Yen, Hsinchu (TW); Daniel Tang, Fremont, CA (US); Tsungnan Cheng, Saratoga, CA (US)

(73) Assignee: Advanced Ion Beam Technology, Inc., Hsin-Chu (TW)

( * ) Notice: Subject to any disclaimer, the term of this patent is extended or adjusted under 35 U.S.C. 154(b) by 254 days.

(21) Appl. No.: 13/648,127

(22) Filed: Oct. 9, 2012

(65) Prior Publication Data

US 2014/0097487 A1 Apr. 10, 2014

(51) Int. Cl.

| | |
|---|---|
| ***H01L 29/78*** | (2006.01) |
| ***H01L 29/66*** | (2006.01) |
| ***H01L 29/06*** | (2006.01) |
| ***H01L 27/088*** | (2006.01) |
| ***H01L 27/12*** | (2006.01) |
| ***H01L 21/762*** | (2006.01) |
| ***H01L 21/223*** | (2006.01) |

(52) U.S. Cl.

CPC ...... *H01L 21/2236* (2013.01); *H01L 29/66803* (2013.01); *H01L 29/785* (2013.01)

(58) Field of Classification Search

USPC .................. 257/327, 347, E21.409, 401, 365; 438/283, 157

See application file for complete search history.

(56) References Cited

U.S. PATENT DOCUMENTS

| | | | | |
|---|---|---|---|---|
| 2007/0084564 | A1* | 4/2007 | Gupta et al. | 156/345.48 |
| 2009/0000946 | A1* | 1/2009 | Singh et al. | 204/298.01 |
| 2010/0084980 | A1* | 4/2010 | Koo | 315/111.41 |
| 2010/0176424 | A1* | 7/2010 | Yeo et al. | 257/255 |
| 2011/0006369 | A1* | 1/2011 | Sonsky et al. | 257/347 |
| 2011/0086501 | A1* | 4/2011 | Papasouliotis et al. | 438/514 |
| 2011/0147842 | A1* | 6/2011 | Cappellani et al. | 257/365 |
| 2011/0175152 | A1* | 7/2011 | Booth et al. | 257/306 |
| 2011/0195555 | A1* | 8/2011 | Tsai et al. | 438/301 |
| 2011/0248323 | A1* | 10/2011 | Ohmi et al. | 257/288 |
| 2011/0309049 | A1* | 12/2011 | Papasouliotis et al. | 216/37 |
| 2012/0000421 | A1* | 1/2012 | Miller et al. | 118/712 |
| 2012/0091538 | A1* | 4/2012 | Lin et al. | 257/401 |
| 2012/0263887 | A1* | 10/2012 | Papasouliotis et al. | 427/569 |
| 2013/0102130 | A1* | 4/2013 | Cheng et al. | 438/478 |
| 2013/0126972 | A1* | 5/2013 | Wang et al. | 257/351 |

* cited by examiner

*Primary Examiner* — Shaun Campbell
*Assistant Examiner* — Thai T Vuong
(74) *Attorney, Agent, or Firm* — Morrison & Foerster LLP

(57) ABSTRACT

In plasma doping a non-planar semiconductor device, a substrate having a non-planar semiconductor body formed thereon is obtained. The substrate having the non-planar semiconductor body may be placed into a chamber. A plasma may be formed in the chamber and the plasma may contain dopant ions. A first bias voltage may be generated to implant dopant ions into a region of the non-planar semiconductor body. A second bias voltage may be generated to implant dopant ions into the same region. In one example, the first bias voltage and the second bias voltage may be different.

23 Claims, 11 Drawing Sheets

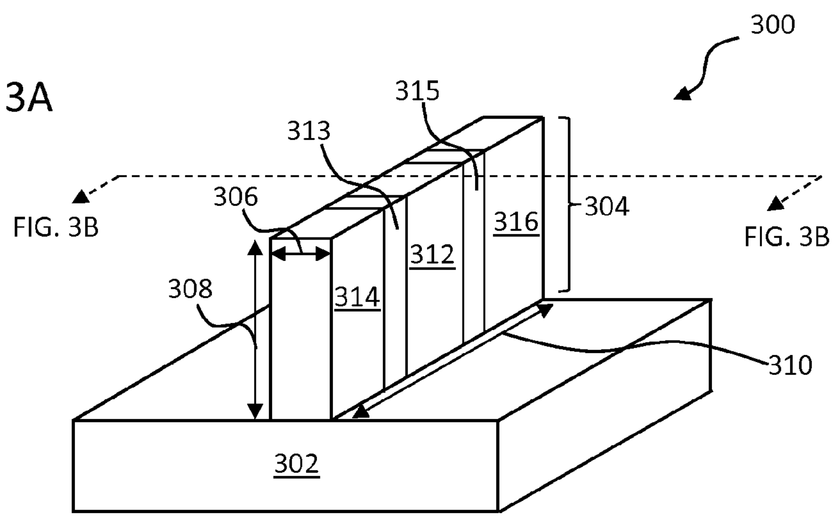
FIG. 3A
300
315
313
306
FIG. 3B
FIG. 3B
316
304
312
314
308
310
302
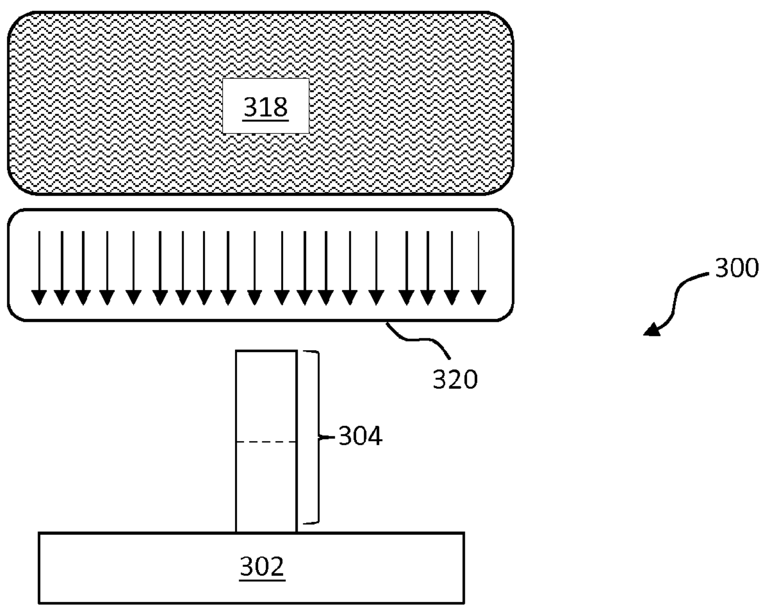
FIG. 3B
318
300
320
304
302

522
518
500

508
506
504
506
514
502

522
518
521
500
520

506
506
514
504
502

PLASMA DOPING A NON-PLANAR SEMICONDUCTOR DEVICE

BACKGROUND

1. Field

This relates generally to the manufacturing of semiconductor devices and, more specifically, to methods for plasma doping a non-planar semiconductor device.

2. Related Art

As semiconductor manufacturers continue to shrink the dimensions of transistor devices in order to achieve greater circuit density and higher performance, short-channel effects, such as parasitic capacitance and off-state leakage, increasingly impair transistor device characteristics. Fin field effect transistors (FinFETs), such as double-gate transistors, tri-gate transistors, and gate-all-around transistors, are a recent development in semiconductor processing for controlling such short-channel effects. A FinFET has a fin that protrudes above a substrate surface. The fin creates a longer effective channel length, thereby reducing short channel effects.

The fin defines the channel, the source/drain regions, and the source/drain extension regions of the FinFET. Like conventional planar metal-oxide semiconductor field effect transistors (MOSFETs), the channel, source/drain regions, and source/drain extension regions of a FinFET device are doped with impurities (i.e., dopants) to produce desired electrical characteristics. Ideally, these regions are each uniformly doped along the height of the fin. Poor dopant uniformity may cause undesirable threshold voltage variations across the height of the gate as well as source/drain punch-through issues.

Plasma doping (also known as plasma immersion ion implanting) is one method for doping the channel, source/drain, and source/drain extension regions of a FinFET device. However, achieving a uniform dopant profile across the height of the fin may be challenging using plasma doping. The plasma sheath formed during plasma doping may be very large relative to the dimensions of the fins and thus the plasma sheath may not conform to the fin. As a result, plasma doping may occur mainly in the vertical direction where the top of the fin may be more heavily doped than the bottom of the fin.

SUMMARY

In one exemplary embodiment, a substrate having a non-planar semiconductor body formed thereon is obtained. The substrate having the non-planar semiconductor body may be placed into a chamber. A plasma may be formed in the chamber where the plasma may contain dopant ions. A first bias voltage may be generated to implant dopant ions into a region of the non-planar semiconductor body. A second bias voltage may be generated to implant dopant ions into the same region. In one example, the first bias voltage and the second bias voltage may be different.

BRIEF DESCRIPTION OF THE DRAWINGS

FIGS. 3A-3D illustrate cross-sectional views of an exemplary FinFET at various stages of an exemplary process for plasma doping a FinFET device.

DETAILED DESCRIPTION

Methods for plasma doping a non-planar semiconductor device are described. The following description is presented to enable a person of ordinary skill in the art to make and use the various embodiments. Descriptions of specific devices, methods, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims. For example, exemplary processes for plasma doping a FinFET device may be described. It should be appreciated that these exemplary processes may also be applied to non-planar semiconductor devices other than FinFET devices, such as, non-planar multi-gate transistor devices and non-planar nano-wire transistor devices.

1. Plasma Doping System

Figure 1:
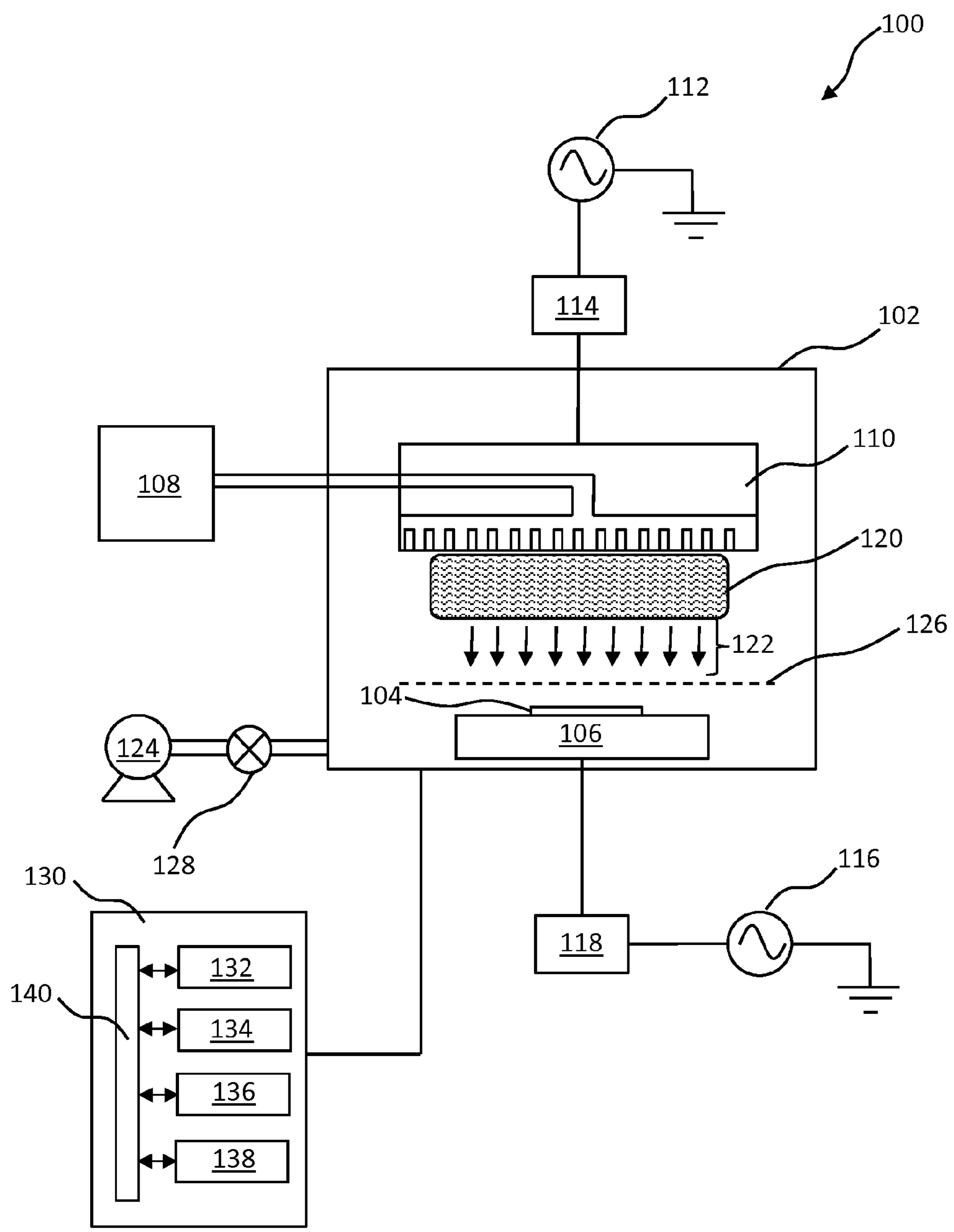
FIG. 1 is a schematic block diagram of an exemplary plasma doping system that may be utilized to plasma dope a FinFET device

FIG. 1 depicts an exemplary plasma doping system 100 that can be used to plasma dope a non-planar semiconductor device, such as a FinFET device. The exemplary plasma doping system 100 may have a chamber 102 enclosed by a cylindrical side wall, a base and a lid. A substrate 104 having a fin formed thereon may be provided into chamber 102 and supported on a support pedestal 106. The temperature of support pedestal 106 may be regulated by a heating and cooling mechanism to control the temperature of substrate 104.

Process gases may be provided into chamber 102 from a gas panel 108 through a showerhead 110. The process gases may be a gas mixture that includes at least one dopant gas (e.g., boron trifluoride, diborane, phosphine, phosphorus pentafluoride, arsine, etc.) and an inert diluting gas (e.g. helium, argon, neon etc.). A vacuum pump 124 may evacuate chamber 102 through a throttle valve 128 to control the chamber pressure within a desired range (e.g., 2-150 mT).

A plasma 120 may be formed in chamber 102 from the process gases by providing one or more power sources to showerhead 110. For example, a radio frequency (RF) source power 112 may be provided through a matching network 114 to showerhead 110. The RF source power may have a power of 200 W-10 kW and a frequency of 5-30 MHz. Plasma 120 may contain dopant ions formed from the at least one dopant gas in the gas mixture. Plasma 120 may be formed between showerhead 110 and substrate 104 and a plasma sheath 122 may be formed between plasma 120 and substrate 104.

An RF bias power 116 may be provided through a matching network 118 to support pedestal 106. RF bias power 116 may have a power of 50-500 W and a frequency of 0.5-5 MHz. RF bias power 116 may generate a bias voltage across plasma sheath 122 between plasma 120 and substrate 104. The bias voltage may extract dopant ions from plasma 120 and may accelerate the dopant ions across plasma sheath 122 to implant into the fin on substrate 104. The higher the bias voltage generated, the deeper the dopant ions may be implanted into the fin. RF bias power 116 may generate a bias voltage of 100V-15 kV. The bias voltage may direct dopant ions to implant into the fin at an implant angle substantially vertical to the surface of substrate 104. For example, the implant angle may be approximately 0-10 degrees relative to an axis orthogonal to the surface of substrate 104. An optional electrode screen 126 may be disposed between plasma 120 and substrate 104. A power supply (not shown) may apply an electric potential to electrode screen 126 to accelerate dopant ions across plasma sheath 122 into the fin. Electrode screen 126 may be tilted to direct the dopant ions into the fin at a desired implant angle.

Controller 130 may be coupled to various components of plasma doping system 100 and control plasma doping system 100 to perform the processes for plasma doping a non-planar semiconductor device described herein. The function and characteristics of controller 130 will be described later in greater detail.

Exemplary plasma doping system 100 described herein forms a plasma 120 by capacitive coupling. It should be appreciated that methods of plasma doping a non-planar semiconductor device may be performed using any suitable plasma doping system. For example, plasma 120 may also be generated by inductive coupling. Plasma may also be provided from numerous other plasma source configurations such as a toroidal plasma source, a helicon plasma source, a DC plasma source, or a remote plasma source. It should also be recognized that parameter values such as RF power and RF frequency are given by way of example only and that other values may be utilized within the scope of the invention.

2. Plasma Doping of Non-Planar Semiconductor Devices

Figure 2:
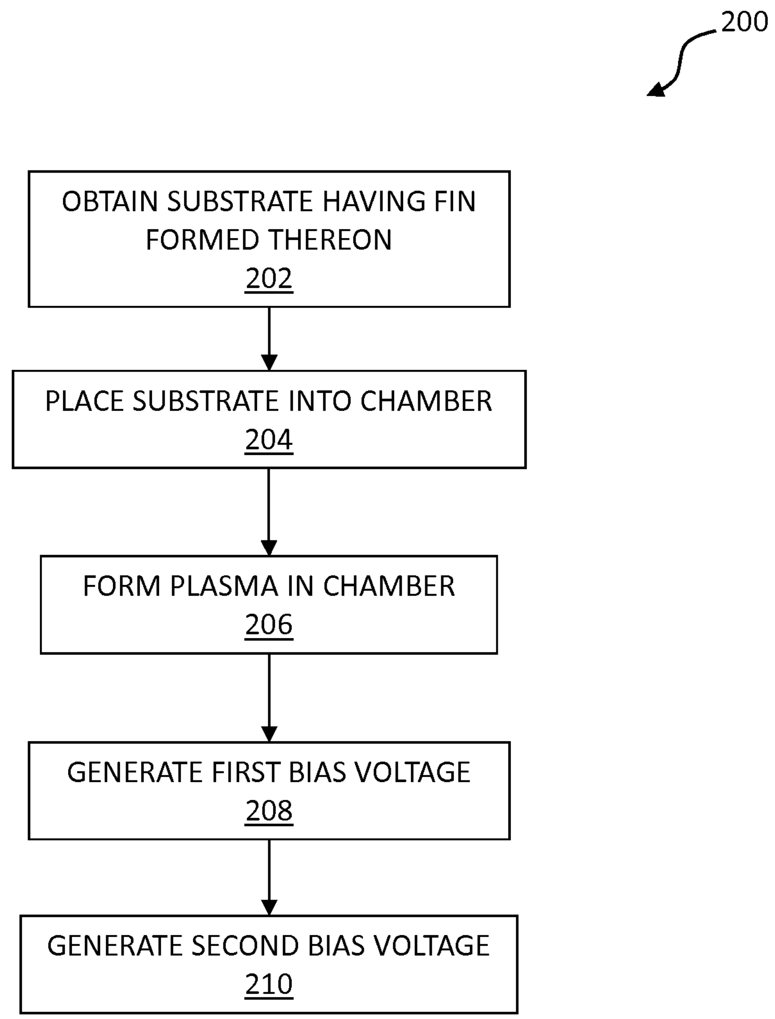
FIG. 2 illustrates an exemplary process for plasma doping a FinFET device.

With reference to FIG. 2, an exemplary process 200 for plasma doping a FinFET device is depicted. At block 202 of process 200, a substrate having a fin formed thereon may be obtained. The fin may include a channel region, a source region, a drain region, a source extension region, and a drain extension region. At block 204, the substrate having the fin may be placed into a chamber. At block 206 a plasma may be formed in the chamber. The plasma may contain dopant ions. At block 208, a first bias voltage may be generated in the chamber to implant dopant ions into a region of the fin. The region may include any one of the channel region, source region, drain region, source extension region, and drain extension region. At block 210, a second bias voltage may be generated in the chamber to implant dopant ions into the same region of the fin. The bias voltage may at least partially determine the depth at which dopant ions are implanted into the fin. In one example, the first bias voltage may be different from the second bias voltage to implant dopant ions at different depths in the fin. In one such example, the first bias voltage may be greater than the second bias voltage.

Figure 3C:
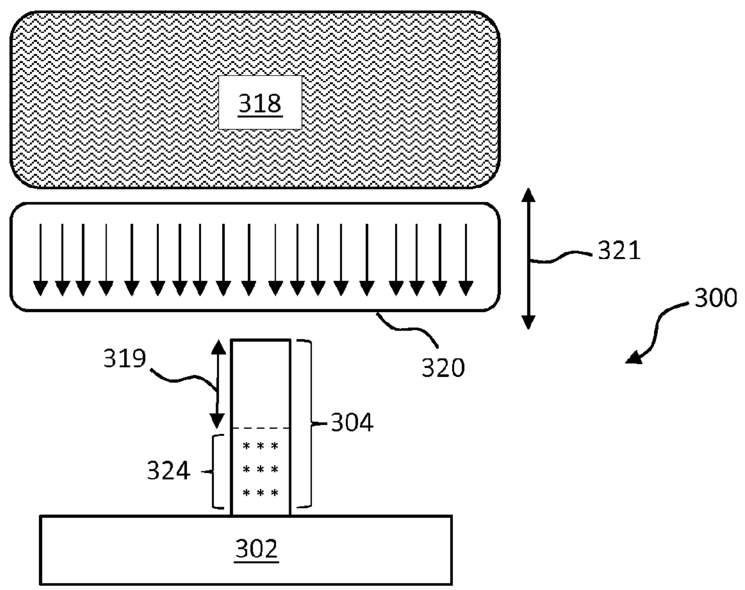

A more detailed description of exemplary process 200 is now provided with simultaneous reference to FIG. 2 and FIGS. 3A-3D. FIGS. 3A-3D illustrate cross-sectional views of a FinFET device 300 at various stages of process 200. At block 202 of process 200 and as shown in FIG. 3A, a substrate 302 having a fin 304 formed thereon may be obtained. Substrate 302 may include any commonly known substrate suitable for forming a FinFET device 300. For example, substrate 302 may include a single crystalline semiconductor wafer (e.g., silicon, germanium, gallium arsenide, etc.). In another example, substrate 302 may include one or more epitaxial single crystalline semiconductor layers (e.g., silicon, germanium, silicon germanium, gallium arsenide, indium phosphide, indium gallium arsenide, etc.) grown atop a distinct crystalline wafer (silicon, germanium, gallium arsenide etc.). The one or more epitaxially grown semiconductor layers may serve as buffer layers to grade the lattice constant from the distinct crystalline wafer to the top surface of substrate 302. In yet another example, substrate 302 may include an insulating layer (e.g., silicon dioxide, silicon oxynitride, a high-k dielectric layer, etc.) in between a single crystalline semiconductor substrate and an epitaxial layer to form, for example, a silicon-on-insulator substrate. It should be recognized that substrate 302 may include other structures and layers, such as shallow trench isolation structures.

Fin 304 on substrate 302 may be formed by conventional semiconductor fabrication methods, such as, but not limited to, photolithography, etch, and chemical vapor deposition. Fin 304 may have a channel region 312 disposed between a source region 314 and a drain region 316. A source extension region 313 may be disposed between channel region 312 and source region 314 and a drain extension region 315 may be disposed between channel region 312 and drain region 316. Fin 304 may comprise a single crystalline semiconductor material (e.g., silicon, germanium, gallium arsenide etc.). Alternatively, fin 304 may comprise multiple layers of epitaxially grown semiconductor materials. In on such example, the multiple layers of epitaxially grown semiconductor materials may form a vertical array of multiple nanowires in the channel region. As shown in FIG. 3A, fin 304 may have a critical dimension 306, a height 308, and a length 310. In one example, critical dimension 306 may be 5-50 nm, height 308 may be 15-150 nm, and length may be 20-1200 nm.

At block 204 of process 200, substrate 302 having fin 304 may be placed into a chamber. The chamber may be any suitable chamber capable of plasma doping a non-planar semiconductor device, such as, chamber 102 in FIG. 1. At block 206 and as shown in FIG. 3B, a plasma 318 is formed in the chamber and a plasma sheath 320 is formed between plasma 318 and substrate 302. As previously described in FIG. 1, plasma 318 may be formed by providing process gases into the chamber and providing at least one power source (e.g., an RF source power). The process gases may include at least one dopant gas which subsequently forms dopant ions in plasma 318. The type of dopant gas provided into the chamber may determine the type of dopant ions formed in plasma 318. For example, p-type dopant gases, such as, diborane and boron trifluoride form p-type dopant ions, such as, B+, BF+, BF2+, and BF3+, in plasma 318. Conversely, n-type dopant gases, such as, arsine and phosphine, form n-type dopant ions, such as, P+ and As+, in plasma 318. An appropriate type of dopant gas may therefore be selected to plasma dope a region of fin 304 with the desired type of dopant ions. The channel region 312 is typically implanted with p-type dopant ions when forming a NMOS transistor device and with n-type dopant ions when forming a PMOS transistor device. Conversely, the source/drain regions 314, 316, and the source/drain extension regions 313, 315 are typically implanted with p-type dopant ions when forming a PMOS transistor device and with n-type dopant ions when forming a NMOS transistor device.

At block 208 of process 200 and as shown in FIG. 3C, a first bias voltage 321 may be generated in the chamber. As previously described in FIG. 1, first bias voltage 321 may be generated by supplying an RF bias power to a support pedestal supporting substrate 302. First bias voltage 321 may be generated across plasma sheath 320 to implant dopant ions from plasma 318 into one or more regions of fin 304, such as, the source/drain regions 314, 316, the source/drain extension regions 313, 315, or the channel region 312. The magnitude of the bias voltage at least partially determines the depth at which dopant ions may be implanted into fin 304. The higher the bias voltage the greater the depth at which dopant ions may be implanted into fin 304. First bias voltage 321 may be generated to implant dopant ions mainly to any desired depth in fin 304. As shown in FIG. 3C, first bias voltage 321 may be generated to implant dopant ions mainly to a depth 319 in a bottom portion 324 of fin 304. For example, depth 319 may be 2-50 nm. In one example, first bias voltage 321 may be 0.5 kV-15 kV. In another example, first bias voltage 321 may be 2 kV-10 kV. In yet another example, first bias voltage 321 may be 2 kV-6 kV.

The dimensions of plasma sheath 320 may be relatively large compared to the dimensions of fin 304 where plasma sheath 320 forms above fin 304 and does not conform to fin 304. As a result, dopant ions may only implant into the top of fin 304 at an implant angle that is substantially vertical to substrate 302. For example, first bias voltage 321 may implant dopant ions at an implant angle of approximately 0 degrees relative to an axis orthogonal to substrate 302. As previously described, the implant angle may be controlled by tilting an electrode screen disposed above substrate 302 at an angle. For example, the electrode screen may be tilted such that first bias voltage 321 implants dopant ions into fin 304 at a first implant angle relative to an axis orthogonal to substrate 302. In one example, the first implant angle may be 0-10 degrees. In another example, the first implant angle may be 0-5 degrees.

Figure 3D:
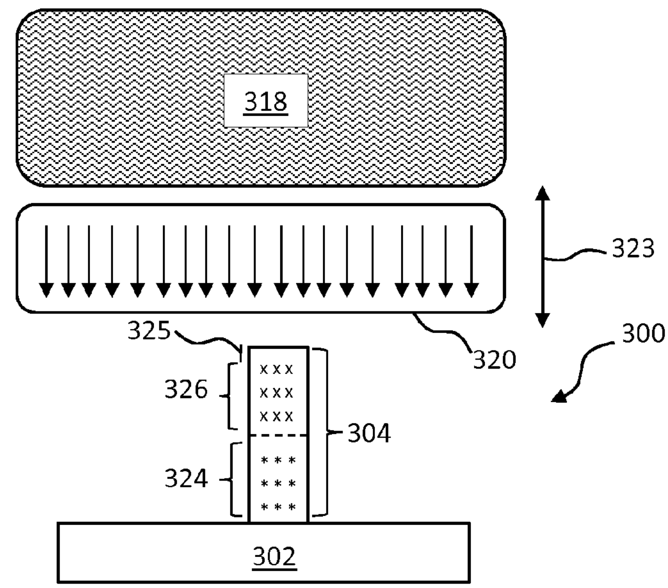

At block 210 of process 200 and as shown in FIG. 3D, a second bias voltage 323 may be generated in the chamber. Second bias voltage 323 may be generated across plasma sheath 320 to implant dopant ions from plasma 318 into the same one or more regions (i.e., source/drain regions, source/drain extension regions, or channel region) of fin 304. Second bias voltage 323 may be defined to implant dopant ions mainly to a depth of 2-33 nm in fin 304. Second bias voltage 323 may be different from first bias voltage 321 where dopant ions may be implanted to a different depth in fin 304. For example, as shown in FIG. 3D, second bias voltage 323 may be lower than first bias voltage 321 where second bias voltage 323 may implant dopant ions to a depth 325 in portion 326 that is that is less than the depth 319 of portion 324. Portion 326 may be on or partially overlapping with portion 324. In one example, second bias voltage 323 may be 0.5 kV-10 kV. In another example, second bias voltage 323 may be 0.5 kV-6 kV. In yet another example, second bias voltage may be 0.5 kV-2 kV.

Second bias voltage 323 may implant dopant ions into fin 304 at an implant angle that is substantially vertical to substrate 302. Alternatively, an electrode screen may be tilted such that second bias voltage 323 implants dopant ions into fin 304 at a second implant angle relative to an axis orthogonal to substrate 302. In one example, the second implant angle may be 1-10 degrees. In another example, the second implant angle may be 2-6 degrees The bias voltage may affect the straggle of dopant ions implanted into fin 304. The straggle is the spread of dopant ions implanted in fin 304. Straggle occurs both in the horizontal direction (e.g., along the length 310 of fin 304) and in the vertical direction (e.g., along the height 308 of fin 304) and increases with bias voltage. Implanting dopant ions at different bias voltages may cause greater overall straggle and may result in poor dopant uniformity across the length 310 and height 308 of fin 304. In the present embodiment, the first implant angle and the second implant angle may be defined to reduce the overall horizontal straggle resulting from implanting at different bias voltages. For example, if first bias voltage 321 is higher than second bias voltage 323, the first implant angle may be defined to be smaller than the second implant angle. In one such example, first bias voltage 321 may be 2-10 kV and the first implant angle may be 0-2 degrees while the second bias voltage 323 may be 0.5-2 kV and the second implant angle may be 2-10 degrees.

Overall straggle may also be reduced by implanting different dopant ion species at different bias voltages. A different dopant ion species may be implanting by providing a different dopant gas into the chamber to form the different dopant ion species in plasma 318. A dopant ion species having a larger molecular mass tends to have a smaller penetration depth and less straggle. To reduce overall straggle, a dopant ion species having a larger molecular mass may be implanted with a higher bias voltage while a dopant ion species having a lower molecular mass may be implanted with lower bias voltage. For example, a dopant ion species of arsenic having a larger molecular mass of 74.9 may be implanted at a higher first bias voltage of 2-10 kV and a dopant ion species of phosphorus having a smaller molecular mass of 31.0 may be implanted at a lower second bias voltage of 0.5-2 kV.

Deeper ion implants may be preferably performed prior to shallower ion implants. In this way, shallower implanted dopant ions do not become displaced ("knocked in") by subsequent deeper implanted. For example, in process 200, the first bias voltage may be greater than the second bias voltage and the first bias voltage may be generated prior to the second bias voltage.

As described, block 210 may be performed in the same chamber as block 208. Alternatively, it should be appreciated that blocks 208 and 210 may be performed in different chambers. For example, at block 210, substrate 302 having fin 304 may be placed into a different chamber than in block 208. A plasma having dopant ions may be formed in the different chamber and a plasma sheath may be formed between the plasma and the substrate 302. A second bias voltage may then be generated across the plasma sheath to implant dopant ions into the fin 304.

It should be appreciated that process 200 may be applied to other non-planar semiconductor devices, such as, but not limited to non-planar multi-gate transistor devices, non-planar gate-all-around transistor devices, and non-planar nanowire transistor devices. For example, fin 304 may be substituted with other non-planar semiconductor bodies such as, nano-wires or vertical arrays of nanowires.

Figure 4:
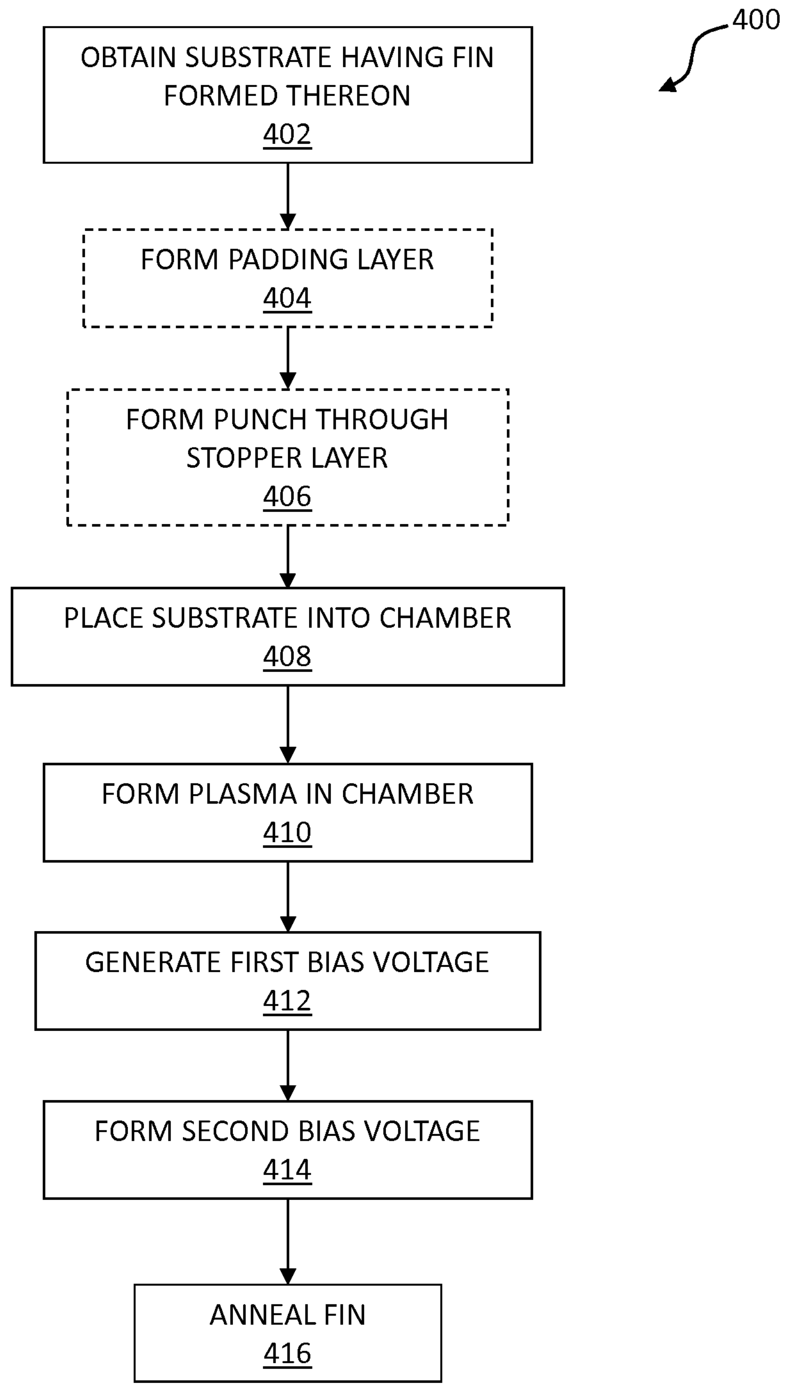
FIG. 4 illustrates another exemplary process for plasma doping a FinFET device.

With reference to FIG. 4, another exemplary process 400 for plasma doping a FinFET device is shown. FIGS. 5A-5F illustrate cross-sectional views of a FinFET device 500 representing the various stages in process 400. Process 400 comprises blocks 402 to 416. Optional blocks 404 and 406 are represented with a dotted outline.

Figure 5A:
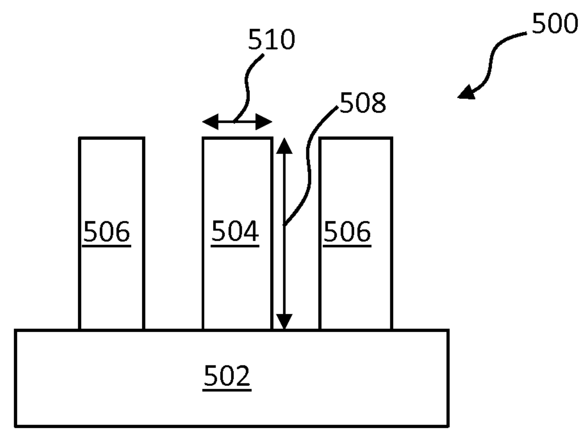
FIGS. 5A-5G illustrate cross-sectional views of an exemplary FinFET at various stages of an exemplary process for plasma doping a FinFET device.

At block 402 of process 400 and as shown in FIG. 5A, a substrate having a fin 504 formed thereon may be obtained. Substrate 502 may comprise a single crystalline semiconductor substrate, one or more epitaxial grown layers over a distinct silicon wafer, a silicon-on-insulator substrate, or any other well-known substrate on which a FinFET device may be formed. Fin 504 may include source/drain regions, source/drain extension regions, and a channel region. Fin 504 may have a critical dimension 510, a height 508, and a length (not shown). Adjacent structures 506 such as masks, dummy features, or neighboring fins may be formed next to fin 504.

Figure 5B:
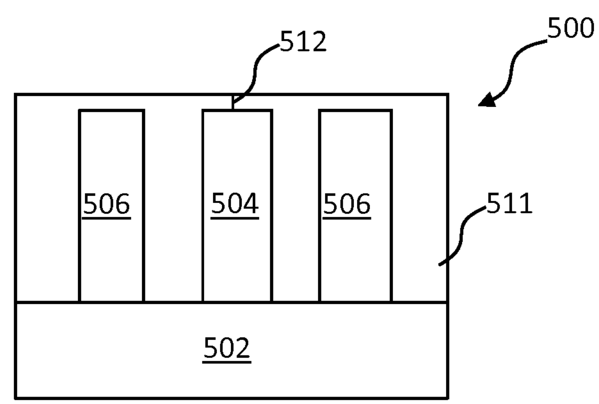

At optional block 404 of process 400 and as shown in FIG. 5B, a padding layer 511 may be formed over and around fin 504 and may fill the areas between fin 504 and adjacent structures 506. Padding layer 511 may block dopant ions from reaching substrate 502 and prevent re-sputtering of dopant ions onto the sidewalls of fin 504 during plasma doping. Additionally, padding layer 511 increases dopant retention in fin 504. The thickness 512 of padding layer 511 above the top surface of fin 504 may be sufficiently thin so as not to impede dopant ions from entering fin 504 during implanting. For example, padding layer 511 may be formed to a thickness 512 of 0-10 nm above the top surface of fin 504. Additionally, padding layer 511 may have a surface that is approximately planar over the fin 504 and adjacent structures 506.

Padding layer 511 may comprise any material that traps implanted dopant ions. For example, padding layer 511 may be a dielectric material or an in-situ doped material, such as, but not limited to, undoped silicon oxide, doped silicon oxide, silicon nitride, organic materials, and silicon oxynitride. Padding layer 511 may be formed by conventional semiconductor processes such as chemical vapor deposition, spin-on deposition, sol-gel deposition processes, selective deposition processes, and selective etch back processes. Padding layer 511 may be formed prior to blocks 408 and 410 in process 400 and may be removed prior or subsequent to block 412 of annealing fin 504.

Figure 5C:
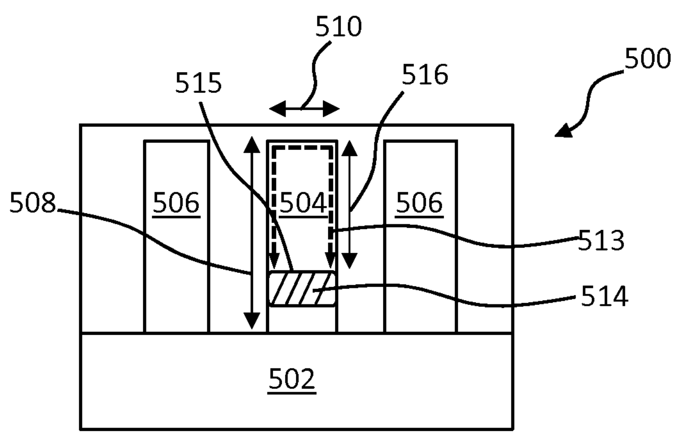

At optional block 406 of process 400 and as shown in FIG. 5C, a punch through stopper (PTS) layer 514 may be formed in fin 504. PTS layer 514 may be formed under the source/drain regions, the channel region and/or the source/drain extension regions of fin 504 to prevent electrical punch-through. The source/drain regions, the channel region and/or the source/drain extension regions may partially overlap with PTS layer 514. Additionally, PTS layer 514 may act as a barrier by blocking or significantly retarding dopant migration during plasma doping and during annealing processes and thus may minimize the vertical straggle of dopants in fin 504. PTS layer 514 may create an abrupt interface 515 between the PTS layer 514 and the source/drain regions, the channel region and/or the source/drain extension regions of fin 504 in which the dopant concentration in each region abruptly extinguishes. For example, PTS layer 514 may be formed such that the sheet resistance (Rs) in the source/drain regions, the channel region and/or the source/drain extension regions increases by 3 orders of magnitude over a 3 nm thickness at the interface 515 between the PTS layer 514 and the source/drain regions, the channel region and/or the source/drain extension regions.

PTS layer 514 may be formed by implanting into fin 504 any species that resist the movement of dopants, such as, but not limited to, carbon, oxygen, fluorine, nitrogen, and any combinations thereof. Alternatively, PTS layer 514 may be formed by implanting a type of dopant ions that is opposite from the type of dopant ions that is implanted above PTS layer 514. For example, the PTS layer 514 may be formed by implanting n-type dopant ions if p-type dopant ions are implanted in the region above PTS layer 514. The implanting may be performed by any suitable implant process such as ion beam implanting or plasma doping. In one example, PTS layer 514 may be formed in the same plasma doping chamber as blocks 412 and 414 in process 400.

The depth 516 at which PTS layer 514 is formed may be approximately equal to the effective height 516 of FinFET device 500. As known in the art, the effective channel width 513 of FinFET device 500 is approximately equal to the sum of twice the effective height 516 of the FinFET and the critical dimension 510 of the fin. Because depth 516 may be controlled by the implant process, the effective channel width 513 of FinFET device 500 may be controlled by implant processes (e.g., ion beam implanting and plasma doping) independent of the physical height 508 of fin 504. In one example, PTS layer 514 may be formed in the substrate 502 under fin 504. In one such example, PTS layer 514 may partially overlap with the bottom of fin 504. In another example, PTS layer 514 may be formed at any depth 516 within fin 504. PTS layer 514 may be preferably formed at a depth 516 greater than the critical dimension 510 of fin 504. For example, PTS layer 514 may be formed in fin 504 at a depth 516 greater than critical dimension 510 and less than height 508 of fin 504. The depth 516 of the PTS layer 514 formed may have a uniformity of 5% or less across the length of fin 504.

Figure 5D:
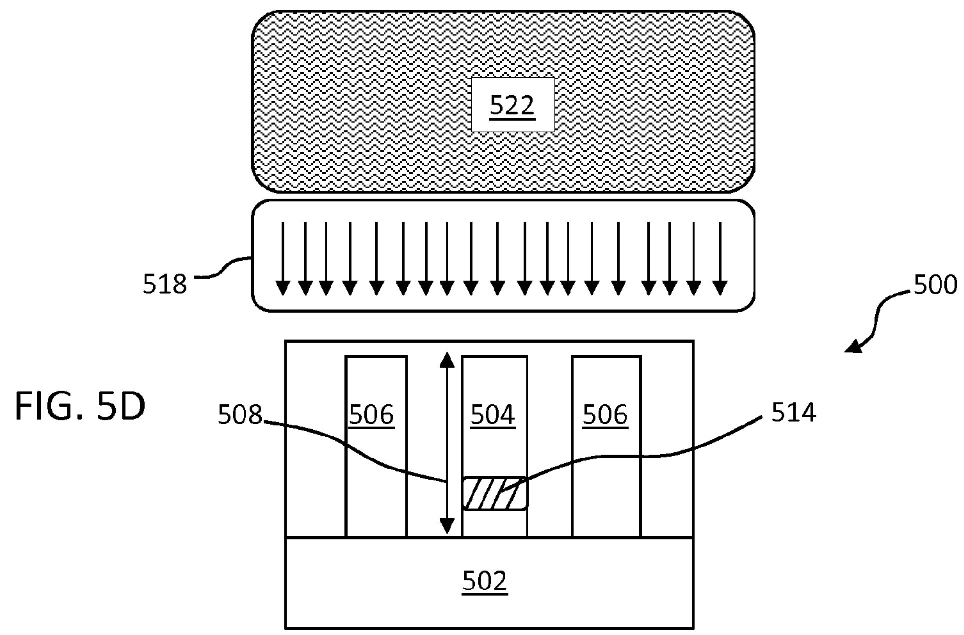

At block 408 of process 400, substrate 502 having fin 504 may be placed into a chamber. The chamber may be any suitable chamber capable of plasma doping, such as, chamber 102 in FIG. 1. At block 410 and as shown in FIG. 5D, a plasma 522 is formed in the chamber and a plasma sheath 518 is formed between plasma 522 and substrate 502. Plasma 522 may contain dopant ions.

Figure 5E:
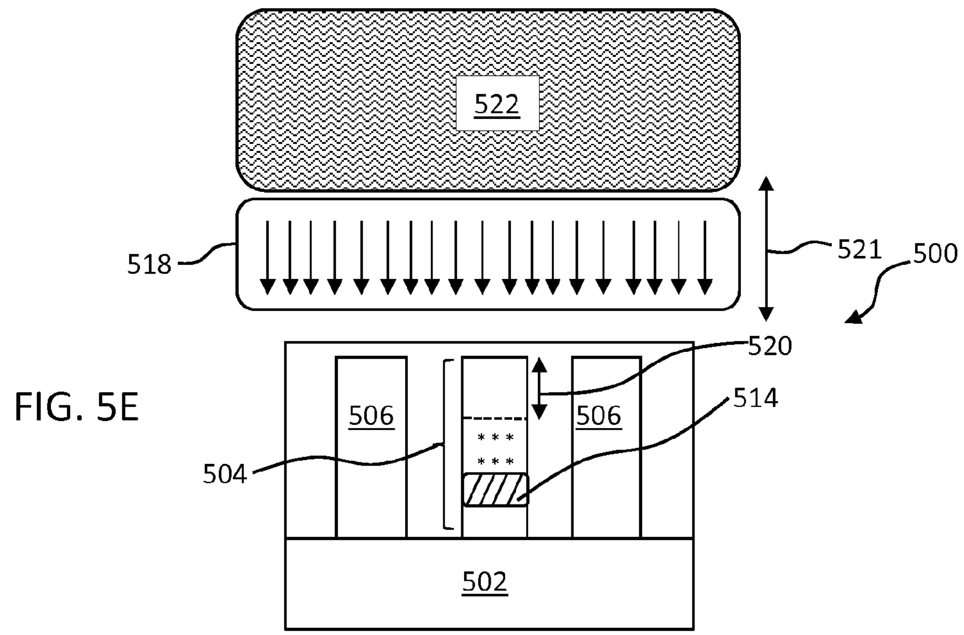

At block 412 of process 400 and as shown in FIG. 5E, a first bias voltage 521 may be generated in the chamber. First bias voltage 521 may be generated to implant dopant ions into one or more regions of fin 504, such as, the source/drain regions, the source/drain extension regions, or the channel region. First bias voltage 521 may implant dopant ions mainly to a depth 520 in fin 504. In one example, depth 520 may be 2-50 nm in fin 504. In one example, first bias voltage 521 may be 0.5 kV-15 kV. In another example, first bias voltage 521 may be 2 kV-10 kV. In yet another example, first bias voltage 521 may be 2 kV-6 kV. First bias voltage 521 may implant dopant ions into fin 504 at an implant angle that is substantially vertical to substrate 502. For example, the implant angle may be approximately 0 degrees. Alternatively, an electrode screen in the plasma doping system, such as electrode screen 126 shown in FIG. 1, may be tilted such that first bias voltage 521 implants dopant ions into fin 504 at a first implant angle. In one example, the first implant angle may be 0-10 degrees. In another example, the first implant angle may be 0-5 degrees.

Figure 5F:
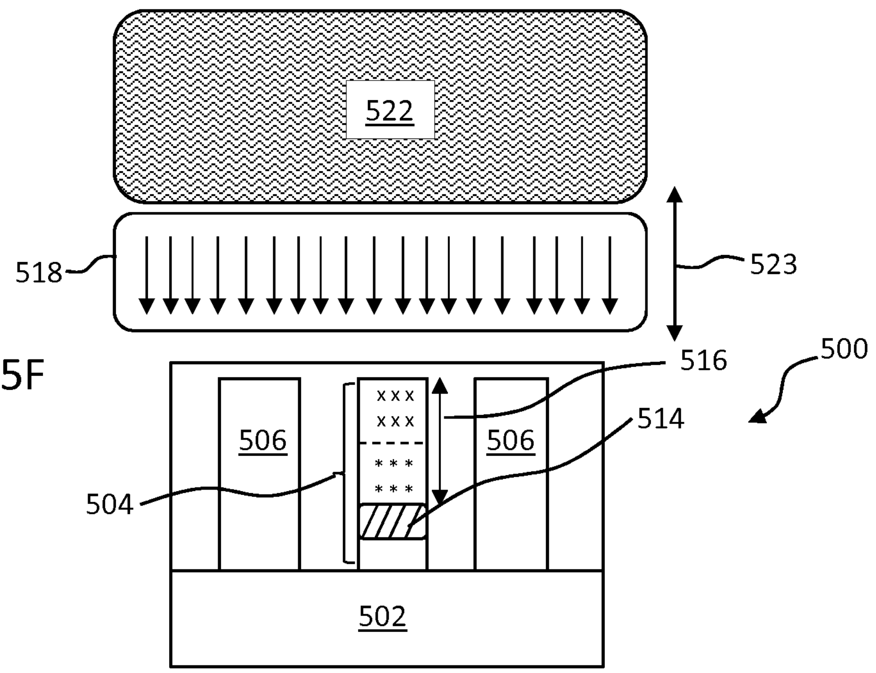

At block 414 of process 400 and as shown in FIG. 5F, a second bias voltage 523 may be generated in the chamber. Second bias voltage 523 may be generated to implant the same type of dopant ions (i.e., p-type or n-type) into the same one or more regions (i.e., source/drain regions, source/drain extension regions, or channel region 312) as first bias voltage 521. Second bias voltage 523 may be defined to implant dopant ions mainly to a depth of 2-33 nm in fin 504. Second bias voltage 523 may be different from first bias voltage 521 where dopant ions may be implanted to a different depth in fin 504. For example, second bias voltage 523 may be lower than first bias voltage 521 where second bias voltage 523 may implant dopant ions to a depth less than that by first bias voltage 521. In one such example, dopant ions implanted by second bias voltage 523 may partially overlap in fin 504 with dopant ions implanted by first bias voltage 521. In one example, second bias voltage 523 may be 0.5 kV-10 kV. In another example, second bias voltage 523 may be 0.5 kV-6 kV. In yet another example, second bias voltage 523 may be 0.5 kV-2 kV. Second bias voltage 523 may implant dopant ions into fin 504 at an implant angle that is substantially vertical to substrate 502. For example, the implant angle may be approximately 0 degrees. Alternatively, an electrode screen may be tilted such that second bias voltage 523 implants dopant ions into fin 504 at a second implant angle. The second implant angle may be approximately equal to the first implant angle. Alternatively, the second implant angle may be different from the first implant angle. In one example, the second implant angle may be 0-10 degrees. In another example, the second implant angle may be 0-5 degrees.

It should be appreciated that additional bias voltages may be generated to implant additional dopant ions into fin 504. For example a third bias voltage (not shown) may be generated. In one example, the total number of bias voltages generated (including the first and second bias voltages) may be 2-20. In another example, the total number of bias voltages generated may be 2-6.

Each additional bias voltage may implant the same type of dopant ions (i.e., p-type or n-type) into the same one or more regions (i.e., source/drain regions, source/drain extension regions, and channel region) as the first and second bias voltages. Each additional bias voltage may also implant dopant ions into fin 504 at any implant angle by tilting an electrode screen in the plasma doping system. Moreover, each of the bias voltages generated may be different. In one example, the bias voltages may be generated in decreasing order to prevent dopant ion displacement ("knocking in") during implanting.

Dopant ions may be implanted at an implant angle that is inversely proportional to the bias voltages. For example, the highest bias voltage may implant dopant ions at the smallest implant angle while the lowest bias voltage may implant dopant ions at the largest implant angle. In one such example, the bias voltages and the corresponding implant angles may be defined to minimize the overall horizontal straggle of dopant ions in fin 504. For example, the bias voltages and the implant angles may be defined to achieve a dopant concentration uniformity of 5% or less across the height of the implanted region of fin 504. In an exemplary process where a PTS layer 514 is formed, the bias voltages and the implant angles may be defined to achieve a dopant concentration uniformity of 5% or less across the depth 516 at which PTS layer 514 is formed.

To reduce overall straggle, one or more bias voltages may implant a dopant ion species having a different molecular mass from that of the other bias voltages. For example, one or more higher bias voltages may implant a dopant ion species having a higher molecular mass than that of the other bias voltages.

Figure 5G:
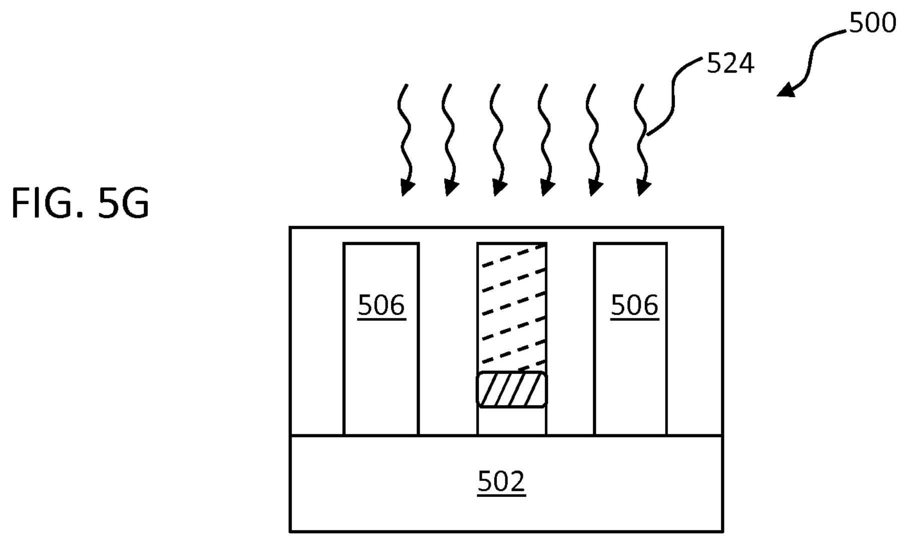

At block 416 of process 400 and as shown in FIG. 5G, fin 504 may be annealed. Annealing is represented by arrows 524. During annealing, implanted dopants in fin 504 are activated. Additionally, implant damage (e.g, amorphization and crystalline damaged) to fin 504 may be repaired by means of crystalline re-growth. During annealing, dopant diffusion may be preferably minimized to maintain good dopant uniformity in fin 504. The annealing may be performed in the same chamber as blocks 408, 410, 412, or 414 of process 400. Alternatively, the annealing may be performed in a separate annealing chamber. Fin 504 may be annealed by an anneal process that minimizes dopant diffusion. For example, fin 504 may be annealed by a laser annealing process or a pulse laser annealing process. In another example, fin 504 may be annealed such that dopant diffusion does not exceed 5 nm.

Figure 7:
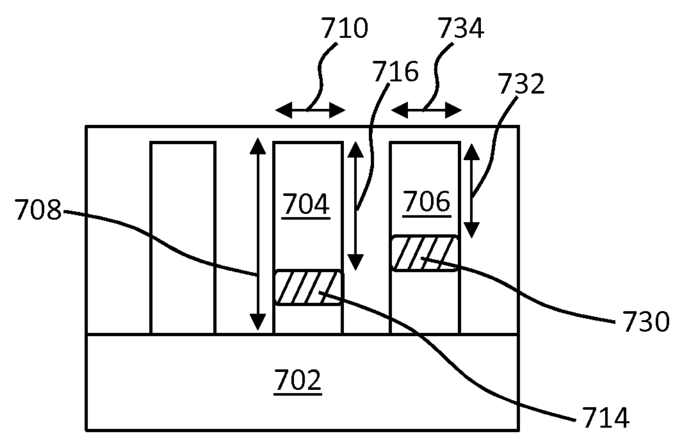
FIG. 7 illustrates a cross-sectional view of exemplary FinFET devices having punch-through stopper layers formed at different depths.

As previously described, the effective channel width 513 of FinFET device 500 may be controlled by the implant process independent of the physical height 508 of fin 504. Thus, the methods and processes of plasma doping a non-planar semiconductor device described herein may be used to fabricated FinFET devices having different effective channel widths on a single substrate without having to form fins having different physical heights. In this way, costly lithography and etch patterning steps may be avoided. For example, with reference to FIG. 7, substrate 702 may be obtained having a first fin 704 and a second fin 706 formed thereon. The first fin 704 and the second fin 706 may have approximately the same fin height 708. The first fin 704 may form a first FinFET device and the second fin 706 may form a second FinFET device. A first PTS layer 714 may be formed in the first fin 704 at a first depth 716 and a second PTS layer 730 may be formed in the second fin 706 at a second depth 732. The first depth 716 and the second depth 732 may be less than or equal to the heights 708 of the first fin 704 and the second fin 706. Additionally, the first depth 716 may be different from the second depth 732 and thus the first FinFET device may have a channel width that is different from that of the second FinFET device. For example, the first FinFET device may have a first channel width that is approximately equal to the sum of twice the first depth 716 and the critical dimension 710 of the first fin 704 while the second FinFET device may have a second channel width that is approximately equal to the sum of twice the second depth 732 and the critical dimension 734 of the second fin 706. Additionally, the first fin 704 and the second fin 706 may be doped according to the methods and processes of plasma doping a non-planar semiconductor device described herein. For example, a first bias voltage may be generated to implant dopant ions into a region of the first fin 704 and a second bias voltage may be generated to implant dopant ions into the region of the first fin 704. A third bias voltage may then be generated to implant dopant ions into a region of the second fin 706 and a forth bias voltage may be generated to implant dopant ions into the region of the second fin 706. In one such example, the first bias voltage and the second bias voltage may be different and the third bias voltage and the forth bias voltage may be different.

It should be appreciated that additional semiconductor processing steps not shown in process 400 may be performed in manufacturing FinFET device 500. For example, a conformal gate dielectric layer may be formed over the channel region of FinFET device 500, a gate electrode may be formed over the conformal gate dielectric layer, and a pair of sidewall spacers may be formed on each side of the gate electrode. The completed FinFET 500 may be a dual-gate FinFET, a tri-gate FinFET, or a gate-all-around FinFET.

Additionally, as previously discussed, it should be appreciated that exemplary process 400 may be applied to other non-planar semiconductor devices, such as, but not limited to non-planar multi-gate transistor devices, non-planar gate-all-around transistor devices, and non-planar nano-wire transistor devices. For example, fin 504 may be substituted with other non-planar semiconductor bodies such as, nano-wires or vertical arrays of nanowires, where the non-planar semiconductor bodies may be plasma doped by exemplary process 400.

Figure 6A:
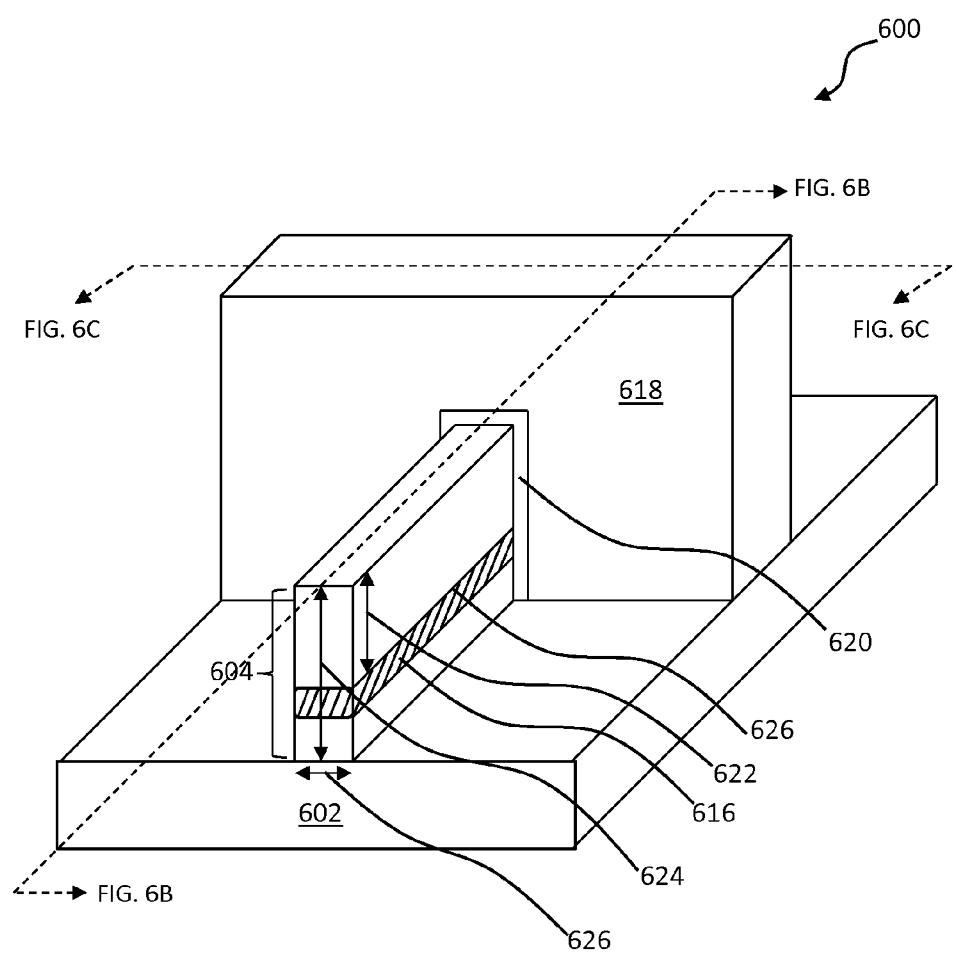
FIGS. 6A-6C illustrate cross-sectional views of an exemplary FinFET device formed by an exemplary process for doping a FinFET device.
Figure 6B:
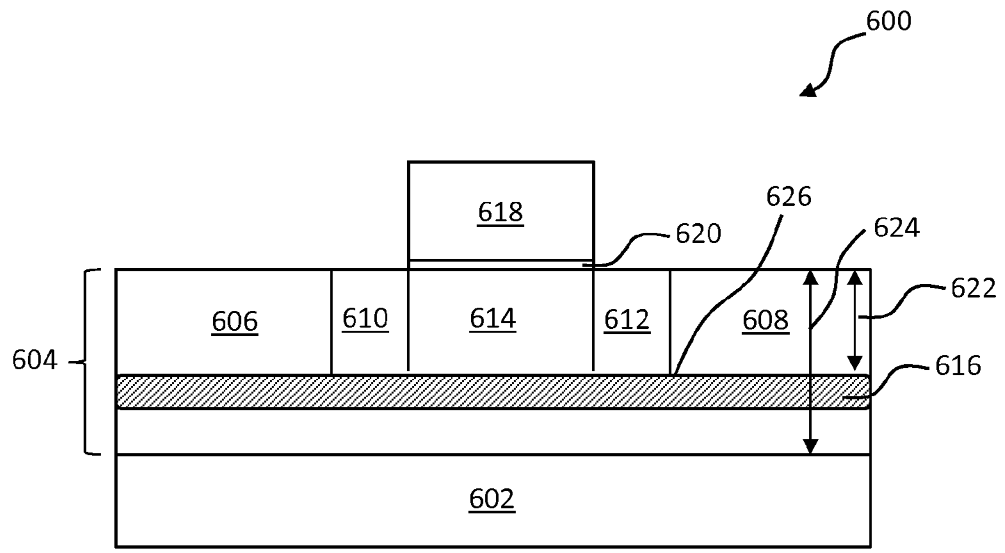
Figure 6C:
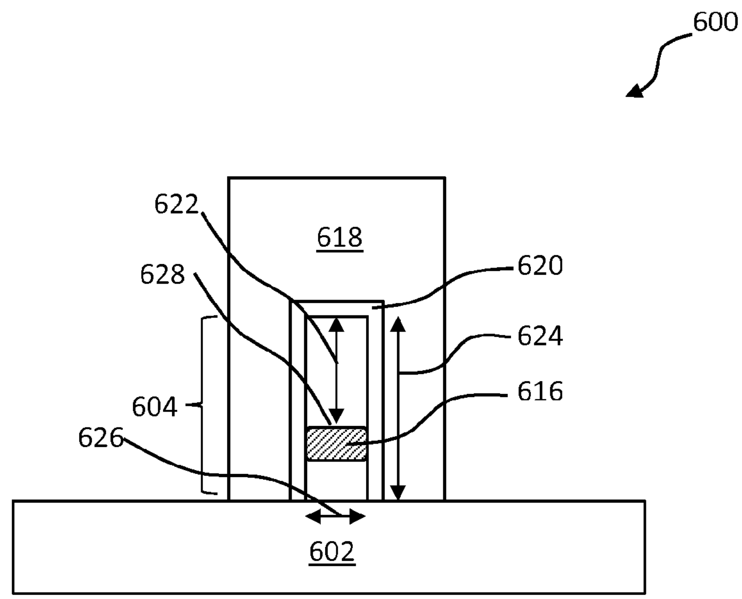

With reference to FIGS. 6A-6C, an exemplary FinFET 600 formed by the exemplary processes described herein is shown. FIG. 6A depicts a three-dimensional cross-sectional view of exemplary FinFET device 600. FIG. 6B depicts a two-dimensional cross-section view of exemplary FinFET device 600 along the length of fin 604. FIG. 6C depicts a two-dimensional cross-section view of exemplary FinFET device 600 along the length of gate electrode 618. In the present embodiment, FinFET device 600 may comprise a fin 604 disposed on a substrate 602. Fin 604 may include a source region 606, a drain region 608, a source extension region 610, a drain extension region 612, and a channel region 614. A PTS layer 616 may be disposed in fin 604 at a depth 622 greater than critical dimension 626 and less than height 624. The channel width of FinFET device 600 may be approximately equal to the sum of twice the depth 622 and the critical dimension 626. Depth 622 of PTS layer 616 may have a uniformity of 5% or less across the length of fin 604. As depicted in FIG. 6B, source/drain regions 606 608, source/drain extension regions 610 612, and channel region 614 may be disposed above PTS layer 616. Any one of the regions may partially overlap with PTS layer 616. Each region may be doped to a concentration uniformity of 5% or less across the depth 622. The dopant concentration in any one region may abruptly extinguish at an interface 628 between PTS layer 616 and source/drain regions 606 608, source/drain extension regions 610 612, and channel region 614. In one example, the sheet resistance (Rs) in any one region may increase by 3 orders of magnitude over a 3 nm thickness at interface 628. A gate dielectric layer 620 may be disposed over the channel region 614 of fin 604. Gate dielectric layer 620 may comprise any suitable electrically insulating material such as, but not limited to, silicon oxide, high-k dielectrics, hafnium oxide, and titanium oxide. A gate electrode 618 may be disposed over the gate dielectric layer 620. Gate electrode 618 may comprise any suitable electrically conductive material such as, but not limited to, doped polysilicon, metals, metal nitrides, metal silicides, titanium, tantalum, and tungsten.

3. Computer Implementation

Referring back to FIG. 1, plasma doping system 100 may have a controller 130. As previously described, controller 130 may be coupled to various components of the plasma doping system 100 and control plasma doping system 100 to perform the processes for plasma doping a non-planar semiconductor device described herein. For example, controller 130 may regulate the flow rates of process gases and the ratios of the process gases provided into chamber 102 by controlling mass flow controllers (not shown) in gas panel 108. Controller 130 may also set the magnitudes and the frequencies of the RF source power and the RF bias power provided into chamber 102 by controlling RF source power 112 and RF bias power 116. Additionally, controller 130 may adjust the electric potential applied to electrode screen 126 by controlling a power source (not shown). Controller 130 may control the implant angle at which dopant ions implant into the fin on substrate 104 by controlling the tilt of electrode screen 126. Moreover, controller 130 may control the chamber pressure in chamber 102 by controlling vacuum pump 124 and throttle valve 128.

Controller 130 may be one of any form of general purpose data processing system that can be used for controlling the various components of plasma doping system 100. Generally, controller 130 may include a processor 132 in communication with a main memory 134, a storage medium 136, and supporting devices 138 through a bus 140. Processor 132 may be one or more general-purpose processing devices such as a microprocessor, a central processing unit (CPU), or the like. Main memory 134 may be random access memory (RAM) or any other dynamic memory for transient storage of information and instructions to be executed by processor 132. Storage medium 136 may include any non-transitory computer-readable storage medium capable of storing computer software, instructions, or data, such as, but not limited to a hard disk, a floppy disk, a magnetic tape, an optical disk, read only memory (ROM) or other removable or fixed media. The supporting devices 138 may include input/output interfaces or communication interfaces such as USB ports, network interface, Ethernet, PCMCIA slot, etc.). The supporting devices 138 may allow computer programs, software, data, or other instructions to be loaded into controller 130 and be provided to processor 132 for execution.

Non-transitory computer-readable storage medium, such as, storage medium 136, or any other suitable media internal or external to controller 130 may contain computer executable instructions (generally referred to as "computer program code" which may be grouped in the form of computer programs or other groupings) for performing any one or more features or functions of the processes of plasma doping a non-planar semiconductor device described herein. One or more of such computer executable instructions, when provided to processor 132 for execution, may cause the controller 130 to control plasma doping system 100 to perform any one or more features or functions of the processes of plasma doping a non-planar semiconductor device described herein.

While specific components, configurations, features, and functions are provided above, it will be appreciated by one of ordinary skill in the art that other variations may be used. Additionally, although a feature may appear to be described in connection with a particular embodiment, one skilled in the art would recognize that various features of the described embodiments may be combined. Moreover, aspects described in connection with an embodiment may stand alone.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A method for plasma doping a non-planar semiconductor device comprising:
- obtaining a substrate having a first non-planar semiconductor body formed thereon;
- placing the substrate into a chamber;
- forming a plasma in the chamber, the plasma containing dopant ions;
- generating a first bias voltage to implant dopant ions into a region of the first non-planar semiconductor body, wherein:
  - the first bias voltage accelerates dopant ions towards the substrate; and
  - the dopant ions accelerated by the first bias voltage are directed at the substrate at a first implant angle with respect to an axis orthogonal to the substrate; and
- generating a second bias voltage to implant dopant ions into the region, wherein:
  - the second bias voltage accelerates dopant ions towards the substrate;
  - the dopant ions accelerated by the second bias voltage are directed at the substrate at a second implant angle with respect to the axis;
  - the first bias voltage is greater than the second bias voltage; and
  - the first implant angle is less than the second implant angle.

2. The method of claim 1, wherein the region is at least one of a channel region, a source region, a drain region, a source extension region, and a drain extension region.

3. The method of claim 1, wherein generating the first bias voltage is prior to generating the second bias voltage.

4. The method of claim 1, wherein generating the first bias voltage implants a first dopant ion species into the region, wherein generating the second bias voltage implants a second dopant ion species into the region, and wherein the first dopant ion species has a molecular mass that is greater than that of the second dopant ion species.

5. The method of claim 1, wherein generating the first bias voltage implants a first dopant ion species into the region, wherein generating the second bias voltage implants a second dopant ion species into the region, and wherein the first dopant ion species has a molecular mass that is different from that of the second dopant ion species.

6. The method of claim 1, further comprising:

generating a third bias voltage to implant dopant ions into the region, wherein the third bias voltage is different from the first bias voltage and the second bias voltage.

7. The method of claim 1, wherein the first non-planar semiconductor body has a height, and wherein the first bias voltage, the first implant angle, the second bias voltage, and the second implant angle are defined to achieve a dopant concentration uniformity in the region of 5% or less across the height.

8. The method of claim 1, further comprising:

forming a padding layer over and around the first non-planar semiconductor body prior to placing the substrate into the chamber.

9. The method of claim 8, wherein the first non-planar semiconductor body has a top surface, and wherein the padding layer is formed to a thickness of 0-10 nanometers above the top surface of the first non-planar semiconductor body.

10. The method of claim 1, further comprising:

forming a punch through stopper layer.

11. The method of claim 10, wherein the punch through stopper layer is formed in the substrate directly below the first non-planar semiconductor body.

12. The method of claim 10, wherein the first non-planar semiconductor body has a critical dimension and a height, and wherein the punch through stopper layer is formed in the first non-planar semiconductor body at a depth greater than the critical dimension and less than the height of the first non-planar semiconductor body.

13. The method of claim 12, wherein the first non-planar semiconductor device has a channel width, and wherein the channel width is approximately twice the depth of the punch through stopper layer summed with the critical dimension.

14. The method of claim 12, wherein the first bias voltage, the first implant angle, the second bias voltage, and the second implant angle are defined to achieve a dopant concentration uniformity in the region of 5% or less across the depth of the punch through stopper layer.

15. The method of claim 12, wherein the first non-planar semiconductor body has a length and wherein the depth of the punch through stopper layer has a uniformity of 5% or less across the length of the first non-planar semiconductor body.

16. The method of claim 1, wherein the obtained substrate has a second non-planar semiconductor body formed thereon, wherein the first non-planar semiconductor body and the second non-planar semiconductor body each have a height, wherein the height of the first non-planar semiconductor body is approximately equal to the height of the second non-planar semiconductor body, and further comprising:

forming a first punch through stopper layer in the first non-planar semiconductor body at a first depth;

forming a second punch through stopper layer in the second non-planar semiconductor body at a second depth, wherein the first depth is different from the second depth, and wherein the first depth and the second depth are less than or equal to the heights of the first non-planar semiconductor body and the second non-planar semiconductor body;

generating a third bias voltage to implant dopant ions into a region of the second non-planar semiconductor body; and generating a forth bias voltage to implant dopant ions into the region of the second non-planar semiconductor body, wherein the third bias voltage and the forth bias voltage are different.

17. The method of claim 16, wherein the first non-planar semiconductor body and the second non-planar semiconductor body each have a critical dimension, wherein the first non-planar semiconductor body forms a first non-planar semiconductor device having a first channel width and the second non-planar semiconductor body forms a second non-planar semiconductor device having a second channel width, and wherein the first channel width is approximately twice the first depth summed with the critical dimension of the first non-planar semiconductor body and the second channel width is approximately twice the second depth summed with the critical dimension of the second non-planar semiconductor body.

18. The method of claim 1, further comprising:

annealing the first non-planar semiconductor body.

19. The method of claim 1, wherein the first non-planar semiconductor body is one of a fin, a nanowire, and a vertical array of nanowires.

20. The method of claim 1, wherein the non-planar semiconductor device is one of a FinFET device, a non-planar multi-gate transistor device, or a non-planar nano-wire transistor device.

21. A method for plasma doping a non-planar semiconductor device comprising:

obtaining a substrate having a non-planar semiconductor body formed thereon;

placing the substrate into a chamber;

forming a plasma in the chamber, the plasma containing dopant ions;

generating a first bias voltage to accelerate dopant ions into a region of the first non-planar semiconductor body;

positioning an electrode screen at a first tilt angle in the chamber to cause the dopant ions accelerated by the first bias voltage to be implanted into the region at a first implant angle with respect to an axis orthogonal to the substrate;

generating a second bias voltage to accelerate dopant ions into the region, wherein the second bias voltage is less than the first bias voltage; and positioning the electrode screen at a second tilt angle in the chamber to cause the dopant ions accelerated by the second bias voltage to be implanted into the substrate at a second implant angle with respect to the axis, wherein the second implant angle is greater than the first implant angle.

22. The method of claim 21, wherein:

the first bias voltage accelerates dopant ions of a first species into the region;

the second bias voltage accelerates dopant ions of a second species into the region; and the dopant ions of the first species have a molecular mass that is greater than a molecular mass of the dopant ions of the second species.

23. A method for plasma doping a non-planar semiconductor device comprising:

obtaining a substrate having a non-planar semiconductor body formed thereon;

forming, using an ion implant process, a punch through stopper layer in the non-planar semiconductor body;

placing the substrate into a chamber;

forming a plasma in the chamber, the plasma containing dopant ions;

generating a first bias voltage to accelerate dopant ions into a region of the first non-planar semiconductor body, wherein the dopant ions accelerated by the first bias voltage are directed at the substrate at a first implant angle with respect to an axis orthogonal to the substrate; and generating a second bias voltage to accelerate dopant ions into the region, wherein:

the dopant ions accelerated by the second bias voltage are directed at the substrate at a second implant angle with respect to the axis;

the first bias voltage is greater than the second bias voltage; and the first implant angle is less than the second implant angle.

* * * * *